United States Patent
Colombo et al.

(10) Patent No.: US 12,253,562 B2
(45) Date of Patent: Mar. 18, 2025

(54) PROCESSING SYSTEM, RELATED INTEGRATED CIRCUIT, DEVICE AND METHOD

(71) Applicants: STMicroelectronics International N.V., Geneva (CH); STMicroelectronics Application GmbH, Aschheim-Dornach (DE)

(72) Inventors: Roberto Colombo, Munich (DE); Vivek Mohan Sharma, New Delhi (IN)

(73) Assignees: STMicroelectronics Application GmbH, Aschheim-Dornach (DE); STMicroelectronics International N.V., Geneva (CH)

( * ) Notice: Subject to any disclaimer, the term of this patent is extended or adjusted under 35 U.S.C. 154(b) by 120 days.

(21) Appl. No.: 18/186,624

(22) Filed: Mar. 20, 2023

(65) Prior Publication Data

US 2023/0314506 A1    Oct. 5, 2023

(30) Foreign Application Priority Data

Apr. 1, 2022  (IT) ........................ 102022000006458

(51) Int. Cl.
*G06F 1/24*     (2006.01)
*G01R 31/317*   (2006.01)
*G01R 31/3185*  (2006.01)
*G06F 11/14*    (2006.01)

(52) U.S. Cl.
CPC . *G01R 31/31721* (2013.01); *G01R 31/31724* (2013.01); *G01R 31/318566* (2013.01); *G06F 1/24* (2013.01); *G06F 11/1441* (2013.01)

(58) Field of Classification Search
CPC ........ G01R 31/31721; G01R 31/31724; G01R 31/318566; G06F 1/24; G06F 11/1441
See application file for complete search history.

(56) References Cited

U.S. PATENT DOCUMENTS

| | | |
|---|---|---|
| 2012/0166131 A1 | 6/2012 | Srinivasan |
| 2016/0085279 A1 | 3/2016 | Culshaw et al. |
| 2020/0143090 A1 | 5/2020 | Patki |

FOREIGN PATENT DOCUMENTS

| | | |
|---|---|---|
| CN | 111880634 A | 11/2020 |
| EP | 3343373 A1 | 7/2018 |
| EP | 3719636 A1 | 10/2020 |
| JP | H10320080 A | 12/1998 |
| WO | 2007049162 A2 | 5/2007 |
| WO | 2013076530 A1 | 5/2013 |

*Primary Examiner* — Zahid Choudhury
(74) *Attorney, Agent, or Firm* — Slater Matsil, LLP (57) ABSTRACT

In an embodiment a processing system includes a reset circuit configured to receive a reset-request signal and one or more further reset-request signals, wherein the one or more further reset-request signals are provided by a processing core, one or more further circuits and/or a terminal of the processing system and to generate a combined reset-request signal by combining the reset-request signal and the one or more further reset-request signals, and a hardware test circuit including for each of the one or more further reset-request signals, a respective first combinational circuit configured to selectively assert the respective further reset-request signal, a second combinational logic circuit configured to selectively mask the combined reset-request signal, and a control circuit configured to repeat operations during a diagnostic phase.

20 Claims, 5 Drawing Sheets

PROCESSING SYSTEM, RELATED INTEGRATED CIRCUIT, DEVICE AND METHOD

CROSS-REFERENCE TO RELATED APPLICATIONS

This application claims the benefit of Italian Application No. 102022000006458, filed on Apr. 1, 2022, which application is hereby incorporated herein by reference.

TECHNICAL FIELD

The disclosure relates to an error management within processing systems and in particular to an error management for microcontrollers.

BACKGROUND

Figure 1:
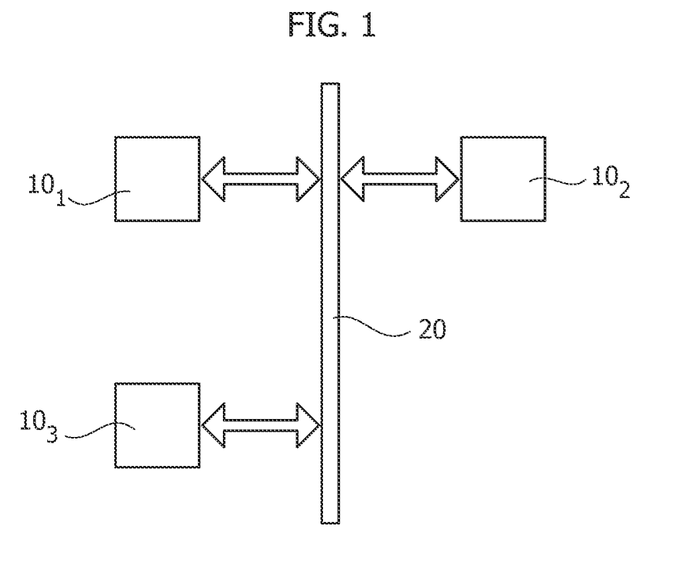
FIG. 1 shows an example of an electronic system comprising a plurality of processing systems.

FIG. 1 shows a typical electronic system, such as the electronic system of a vehicle, comprising a plurality of processing systems 10, such as embedded systems or integrated circuits, e.g., a Field Programmable Gate Array (FPGA), a Digital Signal Processor (DSP) or a microcontroller (e.g., dedicated to the automotive market).

For example, in FIG. 1 are shown three processing systems $10_1$, $10_2$ and $10_3$ connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit, a Transmission Control Unit (TCU), an Antilock Braking System (ABS), a Body Control Module (BCM), and/or a navigation and/or multimedia audio system. Accordingly, one or more of the processing systems 10 may also implement real-time control and regulation functions. These processing systems are usually identified as Electronic Control Units.

In this respect, future generation of such processing systems 10, e.g., micro-controllers adapted to be used in automotive applications, are expected to exhibit an increase in complexity, mainly due to the increasing number of requested functionalities (new protocols, new features, etc.) and to the tight constraints of execution conditions (e.g., lower power consumption, increased calculation power and speed, etc.). For example, recently more complex multi-core processing systems 10 have been proposed. For example, such multi-core processing systems may be used to execute (in parallel) several of the processing systems 10 shown in FIG. 1, such as several ECUs of a vehicle.

Figure 2:
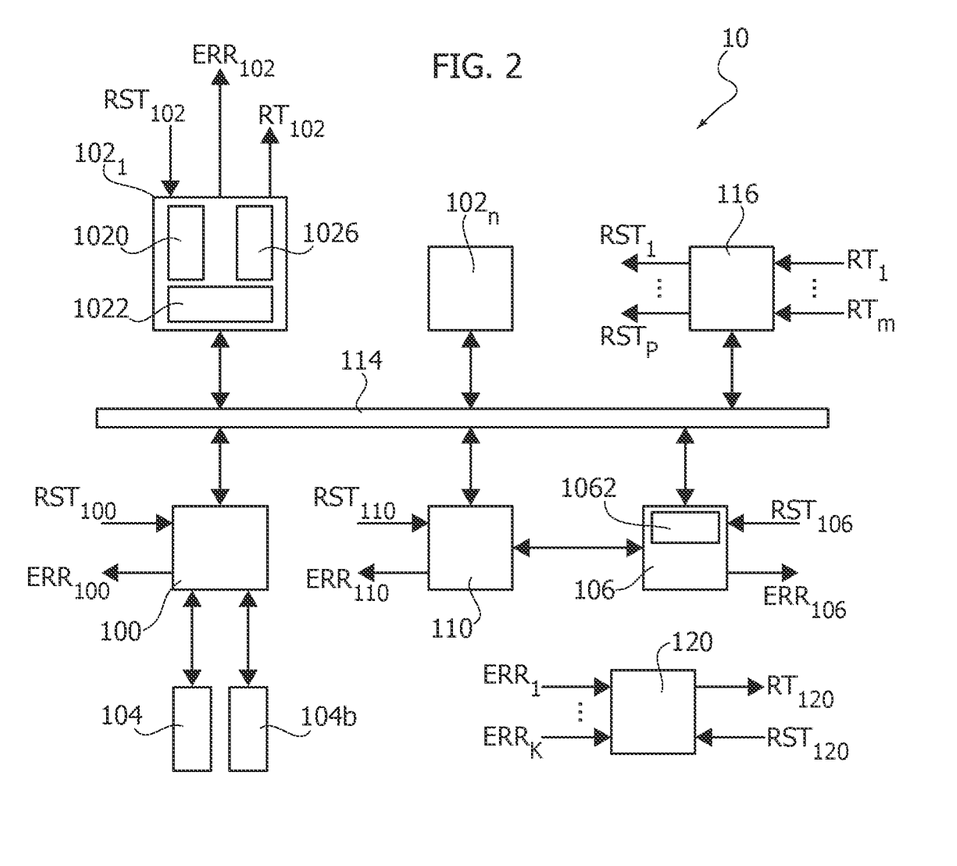
FIG. 2 shows an examples of processing systems.

FIG. 2 shows an example of a processing system 10, such as a multi-core processing system. Specifically, in the example considered, the processing system 10 comprises one or more processing cores 102, such as a plurality of n processing cores $102_1$ ... $102_n$, connected to a (on-chip) communication system 114. For example, in the context of real-time control systems, the processing cores $102_1$ ... $102_n$ may be ARM Cortex®-R52 cores. Generally, the communication system 114 may comprise one or more bus systems, e.g., based on the Advanced eXtensible Interface (AXI) bus architecture, and/or a Network-on-Chip (NoC).

For example, as shown at the example of the processing core $102_1$, each processing core 102 may comprise a microprocessor 1020 and a communication interface 1022 configured to manage the communication between the microprocessor 1020 and the communication system 114. Typically, the interface 1022 is a master interface configured to forward a given (read or write) request from the microprocessor 1020 to the communication system 114, and forward an optional response from the communication system 114 to the microprocessor 1020. However, the communication interface 1022 may also comprise a slave interface. For example, in this way, a first microprocessor 1020 may send a request to a second microprocessor 1020 (via the communication interface 1022 of the first microprocessor, the communication system 114 and the communication interface 1022 of the second microprocessor). Generally, each processing core $102_1$ ... $102_n$ may also comprise further local resources, such as one or more local memories 1026, usually identified as Tightly Coupled Memory (TCM).

Typically, the processing cores 102 are arranged to exchange data with one or more non-volatile memories 104 and/or one or more volatile memories 104b. Generally, the memories 104 and/or 104b may be integrated with the processing cores 102 in a single integrated circuit, or the memories 104 and/or 104b may be in the form of a separate integrated circuit and connected to the processing cores 102, e.g., via the traces of a printed circuit board.

Specifically, in a multi-core processing system 10 these memories are often system memories, i.e., shared for the processing cores $102_1$ ... $102_n$. For example, for this purpose, the communication with the memories 104 and/or 104b may be performed via one or more memory controllers boo connected to the communication system 114. As mentioned before, each processing cores 102 may, however, comprise one or more additional local memories 1026.

For example, the software executed by the microprocessor(s) 1020 is usually stored in a non-volatile program memory 104, such as a Flash memory or EEPROM, i.e., the memory 104 is configured to store the firmware of the processing unit 102, wherein the firmware includes the software instructions to be executed by the microprocessor 102. Generally, the non-volatile memory 104 may also be used to store other data, such as configuration data, e.g., calibration data. Conversely, a volatile memory 104b, such as a Random-Access-Memory (RAM), may be used to store temporary data.

Often, the processing system 10 comprises also one or more (hardware) resources/peripherals 106, e.g., selected from the group of:

one or more communication interfaces, e.g., for exchanging data via the communication system 20, such as a Universal asynchronous receiver/transmitter (UART), Serial Peripheral Interface Bus (SPI), Inter-Integrated Circuit ($I^2C$), Controller Area Network (CAN) bus, and/or Ethernet interface, and/or a debug interface; and/or one or more analog-to-digital converters and/or digital-to-analog converters; and/or one or more dedicated digital components, such as hardware timers and/or counters, or a cryptographic co-processor; and/or one or more analog components, such as comparators, sensors, such as a temperature sensor, etc.; and/or one or more mixed signal components, such as a PWM (Pulse-Width Modulation) driver.

Generally, a dedicated digital component may also correspond to a FPGA integrated in the processing system 10. For example, in this case, the memory 104 may also comprise the program data for such a FPGA.

The resources 106 are usually connected to the communication system 114 via a respective communication interface 1062, such as a peripheral bridge. For example, for this purpose, the communication system 114 may indeed comprise an Advanced Microcontroller Bus Architecture (AMBA) High-performance Bus (AHB), and an Advanced Peripheral Bus (APB) used to connect the resources/peripherals 106 to the AMBA AHB bus. In general, the communication interface 1062 comprises at least a slave interface. For example, in this way, a processing core 102 may send a request to a resource 106 and the resource returns given data. Generally, one or more of the communication interfaces 1062 may also comprise a respective master interface. For example, such a master interface, often identified as integrated Direct Memory Access (DMA) controller, may be useful in case the resource has to start a communication in order to exchange data via (read and/or write) request with another circuit connected to the communication system 114, such as a resource 106 or a processing core 102.

Often such processing systems 10 comprise also one or more general-purpose DMA controllers 110. For example, as shown in FIG. 2, a DMA controller 110 may be used to directly exchange data with a memory, e.g., the memory 104b, based on requests received from a resource 106. For example, in this way, a communication interface may directly read data (via the DMA controller 110) from the memory 104b and transmit these data, without having to exchange further data with a processing unit 102. Generally, a DMA controller 110 may communicate with the memory or memories via the communication system 114 or via one or more dedicated communication channels.

In this respect, irrespective of the complexity of the processing system 10 (e.g., with respect to the number of processing cores 102 and/or number and type of the resources 106), a typical processing system comprises also a reset circuit 116.

For example, such as reset circuit 116 may be configured to receive one or more reset-request signals RT, such as signal $RT_1, \ldots, R_m$, indicating a given event. For example, each of the reset-request signals RT may be selected from the group of:
- a reset-request signal provided by a power supply monitoring circuit of the processing system 10, wherein the power supply monitoring circuit asserts the reset-request signal RT when the supply voltage of the processing system 10a has been switched on;
- a reset-request signal provided by a respective reset terminal, such as pins or pads of a respective integrated circuit comprising the processing system 10;
- a reset-request signal $RT_{102}$ provided by a processing core 102, in particular a respective microprocessor 1020 configured to assert the respective reset-request signal $RT_{102}$ via software instructions.

Often one or more reset-request signals $RT_{120}$ may also be provided by a fault collection and error management circuit 120. For example, such a fault collection and error management circuit 120 may receive one or more error signal ERR, such as error signals $ERR_1, \ldots, ERR_k$, and selectively assert a reset-request signals $RT_{120}$ as a function of the error signals $ERR_1, \ldots, ERR_k$. For example, each error signals ERR may correspond to an error signal $ERR_{100}$ provided by a memory controller 100, an error signal $ERR_{102}$ provided by a processing core 102, an error signal $ERR_{106}$ provided by a resource 106 and/or an error signal $ERR_{110}$ provided by a DMA controller. For example, European patent application n. EP 3 534 261 A1 or Italian patent application n. 102021000009683 disclose possible embodiments of a fault collection and error management circuit 120, which are incorporated herein by reference for this purpose.

In response to the reset-request signals RT, the reset circuit 116 asserts then one or more reset signals RST, such as reset signal $RST_1, \ldots, RST_p$. For example:
- each memory controller 100 may receive a respective reset signal $RST_{100}$; and/or
- each processing core 102 may receive a respective reset signal $RST_{102}$; and/or
- each resource 106 may receive a respective reset signal $RST_{106}$; and/or
- each DMA controller no may receive a respective reset signal $RST_{110}$; and/or
- the fault collection and error management circuit 120 may receive a reset signal $RST_{120}$.

Generally, the reset may be applied to the whole processing system 10 or individual circuits of the processing system, so called IPs. For example, in order to generate a system reset of the processing system, the reset circuit 116 may assert all reset signals RST contemporaneously or according to a given sequence. Conversely, in order to generate a reset of an individual circuit or a group of circuits, the reset circuit 116 may assert the respective reset signals RST. For example, in response to the reset signal RST, the respective circuit usually resets one or more (and typically all) registers of the respective circuit, thereby bringing the respective circuit in a predetermined condition.

The inventors have observed that for both cases it is particularly relevant to ensure that the reset is properly applied with time coherency, e.g., in order to avoid that the reset logic and associated signals have some malfunction causing no reset to be generated.

For example, in the context of the ISO26262 specification for safety in automotive products, a missed reset generation could be catastrophic. In fact, the ISO26262 specification dictates that, in case of error (as managed by the fault collection and error management circuit 120), within a certain scheduled time the processing system 10, such as a microcontroller, shall be able to enter a safe state. The concept and definition of safe state usually depend on the safety architecture of the processing system 10, but at least one case of safe state is usually always applicable: when the processing system 10 is under reset, it should be in a safe state. Therefore, one way, compliant with ISO26262 specification, to resolve a critical error is to trigger a reset as reaction upon an error, because in this way the processing system 10 should enter a safe state.

SUMMARY

Embodiments provide solutions for verifying the correct operation of a reset circuit of a processing system.

As mentioned before, various embodiments of the present disclosure relate to a processing system, in particular a micro-controller. Specifically, the processing system comprises at least one processing core comprising a microprocessor configured to execute software instructions, a memory controller configured to read the software instructions from a non-volatile memory and a communication system for connecting the memory controller to the processing core. In order to start the processing system, the processing system comprises a power-supply monitoring circuit configured to generate a reset-request signal when the processing system is switched on and the voltage is above a certain power-on voltage threshold, which ensures the correct functionality of the reset start-up phase of the processing system. Accordingly, a reset circuit may receive the reset-request signal and generate a reset of the processing system in response to the reset-request signal.

For example, in various embodiments, the processing core is configured to be reset in response to a reset signal. However, in various embodiments, the processing system comprises also one or more further circuits configured to be reset in response to a respective further reset signal, and the reset circuit receives also one or more further reset-request signals provided by the processing core, the one or more further circuits and/or a terminal of the processing system. For example, the one or more further circuits configured to be reset in response to a respective reset signal may comprise one or more resources or peripherals, wherein each resource or peripherals is configured to be reset in response to a respective reset signal. Conversely, the one or more further reset-request signals may comprise at least one of: a reset-request signal generated by the microprocessor via software instructions; a reset-request signal generated by a fault collection and error management circuit as a function of one or more error signals received from the memory controller, the processing core and/or a resource or peripherals of the processing system; and a reset-request signal received via a terminal of the processing system.

In various embodiments, the reset circuit may thus generate a combined reset-request signal by combining the various reset-request signals and activate the reset procedure in response to the combined reset-request signal. For example, the reset circuit may assert the combined reset-request signal when at least one of the reset-request signals is asserted, and de-assert the combined reset-request signal when the reset-request signals are de-asserted.

Specifically, in various embodiments, in response to the combined reset-request signal, the processing system is configured to execute the following phases in sequence:

a reset phase, where the reset circuit executes a reset of the processing system by generating the reset signal for the processing core and the further reset signals for the one or more further circuits;

a diagnostic phase, where a diagnostic circuit executes one or more tests of the processing system; and a software runtime phase, where the microprocessor is started and executes the software instruction.

For example, for this purpose, the reset circuit may be configured to, in response to the combined reset-request signal, execute the reset of the processing system by asserting the reset signal for the processing core and the further reset signals for the one or more further circuits. Generally, during this phase, the reset circuit may also de-assert one or more reset signals. However, in various embodiments, at least the reset signal of the processing core is maintained asserted.

Once having completed the reset phase, the reset circuit may then generate a signal indicating the start of the diagnostic phase. Accordingly, in response to the signal indicating the start of the diagnostic phase, the diagnostic circuit may execute the one or more tests of the processing system, and generate a signal indicating the end of the diagnostic phase. Accordingly, in response to the signal indicating the end of the diagnostic phase, the reset circuit may start the software runtime phase. For example, for this purpose the reset circuit may de-assert the reset signals according to a predetermined sequence, thereby starting the microprocessor and the further circuit.

In various embodiments, the reset circuit may comprise for each further reset-request signals a respective masking circuit configured to mask the respective further reset-request signals as a function of a respective masking signal. For example, the masking signals may be provided by a register interface connected to the communication system.

In particularly, as mentioned before, various embodiments of the present disclosure relate to solutions for testing the operation of the reset circuit. For this purpose, the processing system comprises a hardware test circuit.

Specifically, in order to test the connection of the reset-request signals to the reset circuit, the optional masking of the reset-request signals and the generation of the combined reset-request signal, the test circuit comprises for each of the one or more further reset-request signals a respective first combinational circuit configured to selectively assert the respective further reset-request signal, preferably prior to its transmission within the processing system, i.e., the distance between the first combinational circuit and the respective processing core or further circuit is smaller than the distance between the first combinational circuit and the reset circuit.

Moreover, in various embodiments, the test circuit comprises a second combinational logic circuit configured to selectively mask the combined reset-request signal, and a control circuit.

Specifically, in various embodiments, the control circuit is configured to repeat during the diagnostic phase a sequence of operations for each of the further reset-request signals. In particular, in various embodiments, the control circuit masks the combined reset-request signal via the second combinational logic circuit, asserts the respective further reset-request signal and de-asserts all other further reset-request signals. Next, the control circuit determines whether the combined reset-request signal provided to the second combinational logic circuit (i.e., prior to the masking operation) is asserted. Accordingly, in response to determining that the combined reset-request signal is de-asserted, the control circuit may generate a signal indicating a failure of the reset circuit. For example, this signal may be provided to the diagnostic circuit.

In various embodiments, the control circuit may also test the connectivity of the reset signals. Specifically, as mentioned before, during the diagnostic phase may still be asserted one or more of the reset signals. Accordingly, by using a processing core and further circuits configured to assert a respective reset-status signal when the circuit is under reset, the control circuit may be configured to monitor the reset-status signals of the circuit, which should be under reset during the diagnostic phase. For example, for this purpose, the control circuit may generate a combined reset-status signal by combining (at least a sub-set of) the reset-status signals, determine whether the combined reset-status signal is asserted, and generate an error signal when the combined reset-status signal is de-asserted.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 3 to 7 parts, elements or components which have already been described with reference to FIGS. 1 to 2 are denoted by the same references previously used in such Figure; the description of such previously described elements will not be repeated in the following in order not to overburden the present detailed description.

As mentioned before, various embodiments of the present disclosure provide solutions for verifying the correct operation of a reset circuit of a processing system. For a general description of a processing system comprising such a reset circuit may thus be made reference to the previous description of FIGS. 1 to 2.

Accordingly, various embodiments of the present disclosure provide solutions for validating the operation of a reset circuit, in particularly with respect to the functionality of the reset generation logic and also the connection of the reset-request signals RT, with the target to avoid that a reset-request might be lost because of a possible malfunction.

Moreover, in various embodiments, the solution may not only verify each reset-request signal RT generated within the processing system, but also the connection of the reset signals RST to the individual circuits.

Various embodiments of the present disclosure may thus be used to provide a coverage according the ASIL-D level of the ISO26262 specification.

Figure 3:
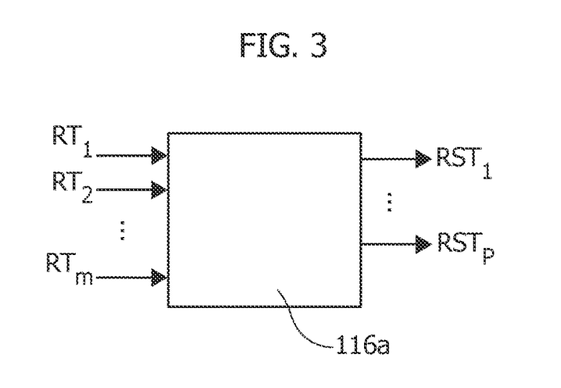
FIG. 3 shows a block diagram of a reset circuit.

FIG. 3 shows an embodiment of a reset circuit 116a, also called reset generator circuit. Specifically, in the embodiment considered, and as described in the foregoing, the reset circuit 116a is configured to receive at least one reset-request signal RT, such as signals $RT_1, \ldots, RT_m$, and generates at least one reset signal RST, such as signals $RST_1, \ldots, RST_p$. For example, the reset-request signals RT and/or reset signals RST may be trigger signals, i.e., a signal wherein an event is signaled via a pulse of a given number of clock cycles.

For example, in various embodiments, the reset circuit 116a may be configured to generate a single system reset signal, which is provided to all circuits receiving a reset signal.

Alternatively, one or more of the circuits, such as the circuits 100, 102, 106 and/or 110, may receive individual reset signals as shown in FIG. 2. For example, in this case, the reset circuit 116a may be implemented with a sequential logic circuit/finite state machine (FSM) configured to generate a system reset by selectively asserting and de-asserting the individual reset signals in sequence. In fact, the reset process of a system reset may comprise a sequence of states, wherein each state is dedicated to a different task, such as an initialization phase for initializing the NVM memory 104, the configuration phase for reading configuration data from the NVM memory 104 and storing these configuration data to registers of the processing system, etc. For example, in this context may be cited Italian Patent Application n. 102021000007871, which is incorporated herein by reference for this purpose.

Accordingly, the use of individual reset signal RST has the advantage that the reset signals RST may be used to activate or de-activate the reset of several IPs at precise moments during the evolution of the reset sequence.

Moreover, by using individual reset signals RST one or more of the circuits may also be reset during the run-time of the processing system, e.g., a resource 106 may be reset while the processing core(s) 102 are not reset. Accordingly, in order to resolve local malfunctions of a given circuit without the need of a global system reset, the respective circuit may be reset while the micro-processor(s) 1020 are still executing software instruction.

Generally, the following solutions for testing the reset circuit 116a could be used in both cases, i.e., when the reset signal or the reset signals RST generated by the reset circuit 116a comprise a common system reset signal and/or a plurality of individual reset signals.

Figure 4:
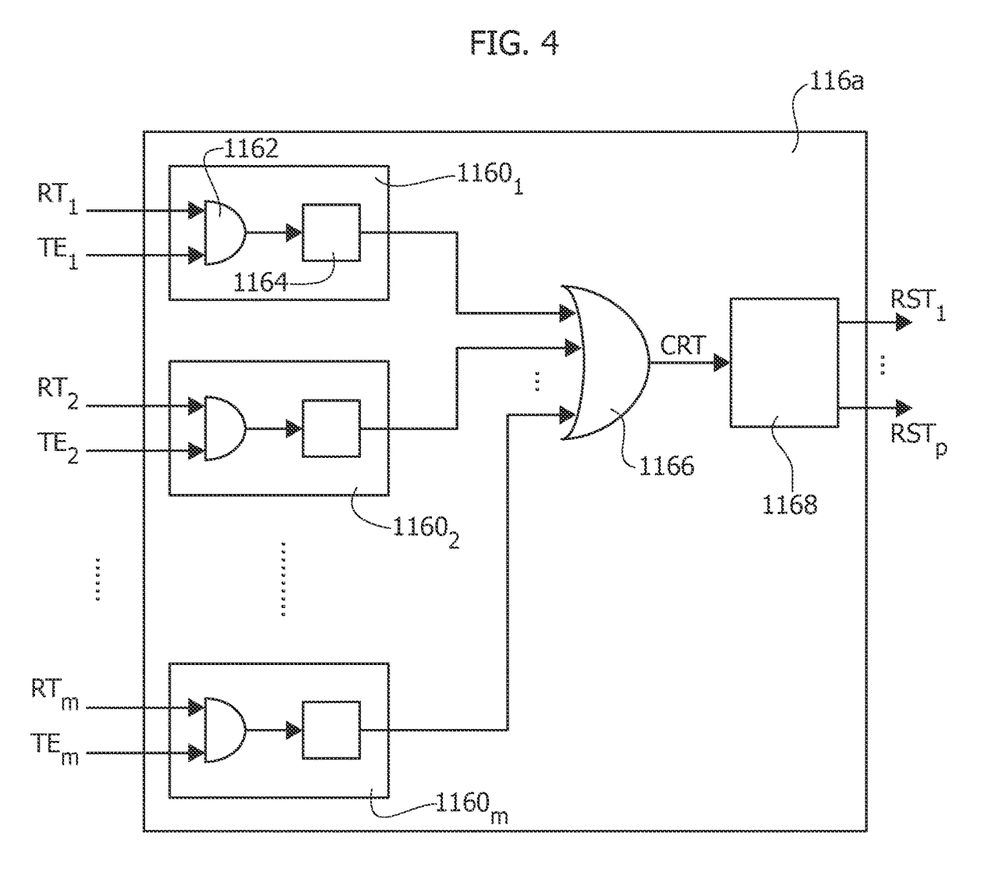
FIG. 4 shows an embodiment of the reset circuit of FIG. 3.

FIG. 4 shows an embodiment of the implementation of the reset circuit 116a.

In the embodiment considered, the reset circuit 116a receives again a plurality of reset-request signals RT, which are generated by various circuits, such as a processing core 102 or a fault collection and error management circuit 120.

In the embodiment considered, the reset circuit 116a is configured to generate one or more combined reset-request signals CRT as a function of the reset-request signals RT. For example, in various embodiments, a combined reset-request signal CRT is generated via a combinational logic circuit 1166 configured to:
  assert the combined reset-request signal CRT when at least one of the reset-request signal RT is asserted; and
  de-assert the combined reset-request signal CRT when all reset-request signals RT are de-asserted.

For example, assuming that the reset-request signals RT and the combined reset-request signal CRT are asserted when the respective signal is set to high, the combinational logic circuit 1166 may be implemented with a logic OR gate.

In various embodiments, the reset circuit 116a is configured to selectively enable or disable one or more (and possibly all) reset-request signals RT. For example, for this purpose, a reset-request signal RT may be provided to a logic gate 1162 configured to mask or unmask the respective reset-request signal RT when a respective masking signal TE has a given logic level. For example, assuming that a reset-request signal RT is asserted when the signal is set to high and the signal should be masked when the masking signal TE is set to low, the combinational logic circuit 1162 may be implemented with a logic AND gate receiving at input a given reset-request signal RT and the respective masking signal TE.

In various embodiments, one or more (and possibly all) reset-request signals RT may be synchronized via a respective synchronization circuit 1164, e.g., implemented via a flip-flop or a plurality of flip-flops connected in cascade. Such a synchronization circuit 1164 is often preferable, because a trigger in a reset-request signal RT may be generated by a circuit, which might be running with a different clock with respect to the clock used by the reset circuit 116a, which preferably is a safe internal oscillator clock.

Accordingly, in various embodiments, one or more of the reset-request signals $RT_1, \ldots RT_m$, may be provided to a respective sub-circuit 1160, such as $1160_1, \ldots 1160_m$, wherein each sub-circuit 1160 may comprise a masking circuit 1162 receiving a respective masking signal, such as masking signal $TE_1, \ldots TE_m$, and/or a synchronization circuit 1164. Generally, the position of the masking circuit 1162 and the synchronization circuit 1164 may also be inverted, i.e., the synchronization circuit may synchronize a reset-request signal RT and the masking circuit 1162 may selectively mask the synchronized reset-request signal.

In various embodiments, the reset circuit 116a may be configured to generated a plurality of combined reset-request signal CRT by repeating the sub-circuits 1160 and the combinational logic circuit 1166. Specifically, in this case, each reset-request signal RT may have associated a plurality of sub-circuits 1160 wherein each sub-circuits receives a respective masking signal TE.

In the embodiment considered, the one or more combined reset-request signals CRT are provided to a reset management circuit 1168 configured to generate one or more reset signal RST as a function of the one or more combined reset-request signals CRT. For example, in this way, the reset management circuit 1168 may be activated when anyone of the (unmasked) reset-request signals RT is asserted, e.g., is set to high.

For example, when only a single system reset signal RST is used, the system reset signal RST may correspond to a combined reset-request signal CRT, or the reset management circuit 1168 may be implemented with a combinational logic circuit configured to generate the system reset signal RST as a function of one or more of the combined reset-request signals CRT.

However, as mentioned before, usually, the reset circuit 116a, and in particularly the reset management circuit 1168, is configured to generate a plurality of reset signals $RST_1, \ldots, RST_p$, wherein the reset circuit selectively asserts and de-asserts one or more of the reset signals $RST_1, \ldots, RST_p$ according to a given and usually predetermined sequence. Accordingly, in this case, the reset management circuit 1168 may be implemented with a sequential logic circuit implementing a finite state machine configured to control a sequence of operations.

Accordingly, in various embodiments, in order to verify the operation of the reset circuit 116a, the processing system is configured to verify one or more of (and preferably all):
the connectivity/connection between the circuit generating a reset-request signal RT and the reset circuit 116a;
the operation of the optional sub-circuits 1160, i.e.:
a) the masking of the respective reset-request signal RT via the masking circuit 1162, and/or
b) the synchronization of the respective reset-request signal RT or the respective signal at the output of the masking circuit 1162 via the synchronization circuit 1164, and the respective storage of the synchronized signal to a flip-flop; and
the operation of the combinational logic circuit 1166 used to generate the combined reset signal CRT.

In various embodiments, the processing system is also configured to verify at least one of:

the operation of the reset management circuit 1168; and
the connectivity of the reset signals RST to the respective circuits receiving the reset signals RST.

However, these additional verifications are purely optional, because the processing system may be configured to remain after a power-on in a wait state until a reset is received. Accordingly, in this case, the processing system, in particular the processing cores 102, would not be started when the reset management circuit 1168 of the connectivity to the circuits to be reset is not working correctly.

Accordingly, the test of the reset management circuit 1168 and of the connectivity to the circuits to be reset may be considered covered implicitly by testing the connection to the reset circuit 116a, the operation of the combinational logic circuit 1166 and optionally the sub-circuits 1160. For example, in case of safety critical applications, the operation of the processing system may be monitored via an external watchdog timer, e.g., forming part of a further processing system configured to monitor the operation of an electronic system comprising a plurality of processing systems (see also FIG. 1). Accordingly, in case the initial reset phase after a power-on would not be started or would not be completed, the processing system would not signal the completion of the initialization of the processing system to the watchdog timer (e.g., by asserting a given signal provided to the watchdog timer via software instructions executed by a processing core 102). Accordingly, the external watchdog timer will detect the malfunction of the processing system. For example, in this case, the further processing system may deactivate one or more functionalities at system level and/or may report a malfunction of the processing system.

Figure 5:
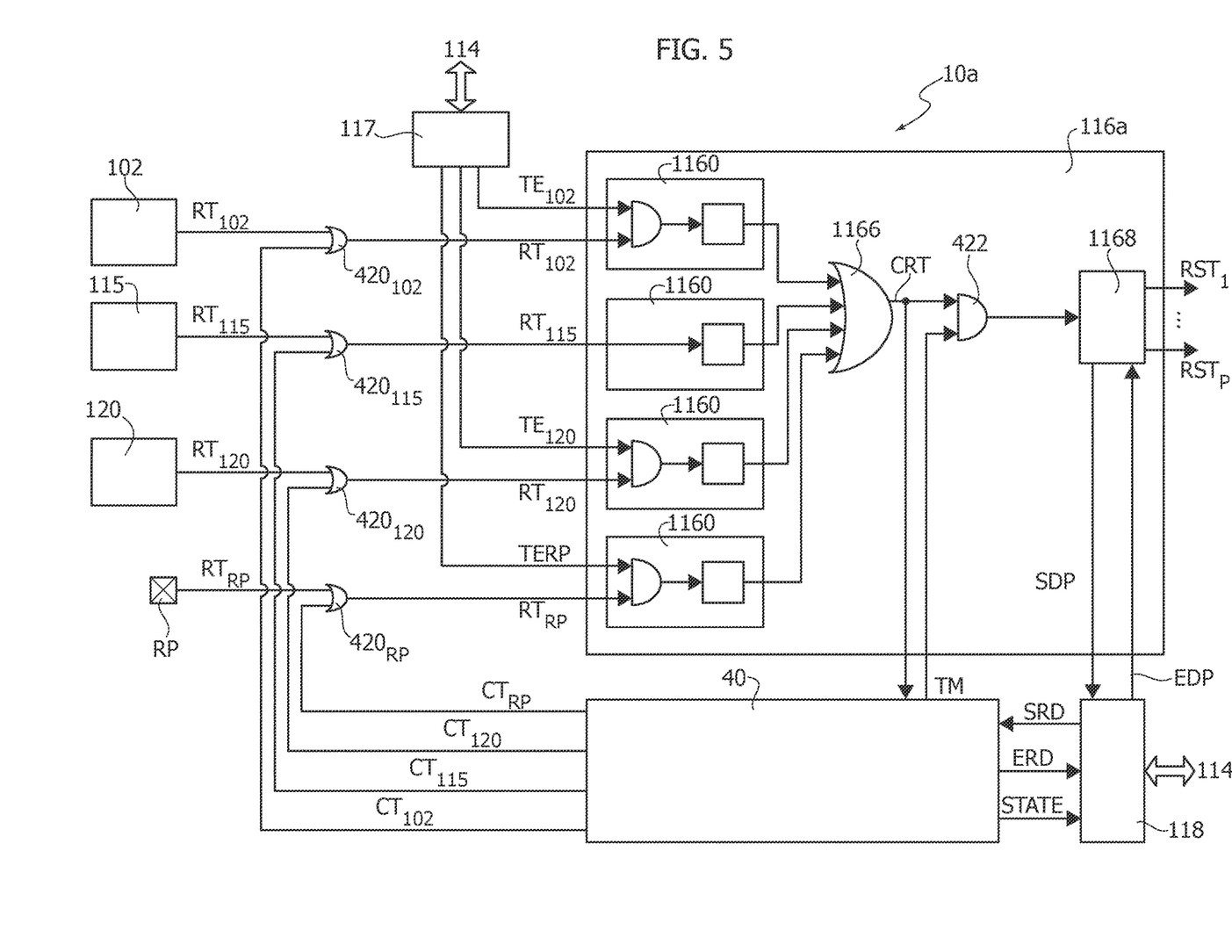
FIG. 5 shows an embodiment of a processing system comprising a reset circuit and a test circuit.

FIG. 5 shows an embodiment of a processing system 10a according to the present disclosure.

In the embodiment considered, the processing system 10a comprises again a reset circuit 116a configured to receive a plurality of reset-request signals RT. For example, in the embodiment considered, a first reset-request signal $RT_{115}$ is generated by a power supply monitoring circuit 115 configured to monitor a supply voltage of the processing system 10a. For example, the power supply monitoring circuit 115 may comprise for this purpose a comparator, e.g., a comparator with hysteresis, i.e., a Schmitt trigger, configured to compare the supply voltage with one or more threshold values. Accordingly, in this way, the signal $RT_{115}$ may request a reset of the processing system 10a when the processing system 10a is switched on.

As described in the foregoing, further reset-request signals RT may be provided by other circuits, such as IP cores, of the processing system 10a. For example, in various embodiments, one or more second reset-request signals $RT_{102}$ may be provided by each processing core 102 of the processing system 10a. For example, in this way, a reset-request signal $RT_{102}$ may be asserted via software instructions executed by the respective microprocessor 1020. Additionally or alternatively, one or more reset-request signals $RT_{120}$ may be provided by fault collection and error management circuit 120. For example, in this case, a reset-request signal $RT_{120}$ may be asserted in case of a malfunction signaled via one or more error signals ERR (see the description of FIG. 2). Additionally or alternatively, one or more reset-request signals $RT_{RP}$ may be provided by one or more respective terminals RP of the processing system 10a, such as pins or pads of a respective integrated circuit comprising the processing system, in particular the circuits 102, 115, 116a, 120.

In the embodiment considered, the reset circuit 116a receives thus the signals RT, e.g., the signals $RT_{102}, RT_{115}$, $RT_{120}$ and $RT_{RP}$. In the embodiment considered, each reset signal RT is then provided to a respective sub-circuit 1160 of the reset circuit 116a. As mentioned before, the sub-circuits, and the respective masking circuit 1162 and/or synchronization circuit 1164, are purely optional. For example, each of the reset-request signals $RT_{102}$, $RT_{120}$ and $RT_{RP}$ may be provided to a respective sub-circuit 1160 comprising at least the synchronization circuit 1160, and preferably also the masking circuit 1162. Conversely, the sub-circuit 1160 for the reset-request signal $RT_{115}$ generated by the power supply monitoring circuit 115 may be omitted or may only comprise the synchronization circuit 1164, i.e., the reset-request signal $RT_{115}$ may not be masked, because usually such a reset in response to a power-on of the processing system 10a is necessary.

For example, in the embodiment considered, the masking signals TE, such as signals $TE_{102}$, $TE_{120}$ and $TE_{RP}$, may be provided by a circuit 117. For example, the circuit may be a register interface connected to the communication system 114, which thus permits that the logic levels of the masking signals TE (or at least a subset thereof) may be programmable, e.g., via software instructions executed by a processing core 102.

As described in the foregoing, in various embodiments, the processing system 10a is configured to test the whole chain from the generation of the reset-request signals RT till the output of the combinational logic circuit 1166 configured to generate a combined reset-request signal CRT.

In various embodiments, the processing system 10a comprises for this purpose a test circuit, configured to execute a Reset Built-In Self-Test, also identified as R-BIST in the following. Specifically, as will be described in greater detail in the following the test circuit comprises a control circuit 40, e.g., a hardware sequential logic circuit implementing an FSM, which sequentially asserts one reset-request signals RT at a time and validates the correctness of the combined reset-request signal(s) CRT after the combinational logic circuit(s) 1166.

Specifically, in various embodiments, with one or more reset-request signals RT is associated a respective combinational logic circuit 420 configured to selectively assert the respective reset-request signal RT as a function of a respective (connectivity) test signal CT. For example, in FIG. 5 are shown combinational logic circuits $420_{102}$, $420_{115}$, $420_{120}$ and $420_{RP}$ and respective test signals $CT_{102}$, $CT_{115}$, $CT_{120}$ and $CT_{RP}$ for the reset quests signal $RT_{102}$, $RT_{115}$, $RT_{120}$ and $RT_{RP}$. For example, assuming that a reset-request signal RT is asserted when the signal is set to high, each combinational logic circuit 420 may be implemented with a logic OR gate, whereby the reset-request signal is asserted when the respective test signal CT is set to high. Generally, the combinational logic circuit 420 may not be provided for all reset-request signals RT. For example, the combinational logic circuit $420_{115}$ for the reset-request signal $RT_{115}$ may be omitted, because the processing system 10a would never be started when this reset-request signal $RT_{115}$ would not work correctly.

Specifically, in various embodiments, the modified reset-request signal RT' is generated prior to the transmission via the lines within the integrated circuit, i.e., the distance between the circuit 420 and the respective circuit generating the reset-request signal RT is smaller than the distance between the circuit 4200 and the reset circuit 116a. Accordingly, in the embodiment considered, the reset circuit 116a is configured to receive the reset-request signals RT' (instead of the original reset-request signals RT). Accordingly, in various embodiments, each combinational logic circuit 420 is provided at the output of the respective circuit generating respective the reset-request signal RT and may also be integrated within the respective circuit, e.g.:

the combinational logic circuit $420_{102}$ is provided at the output of (or is integrated in) the respective processing core 102;

the combinational logic circuit $420_{115}$ is provided at the output of (or is integrated in) the power supply monitoring circuit 115;

the combinational logic circuit $420_{120}$ is provided at the output of (or is integrated in) the fault collection and error management circuit 120; and the combinational logic circuit $420_{RP}$ is provided at the output of (or is integrated in) the input circuit of the pin or pad RP.

Accordingly, the circuits 420 may be used to generate a modified reset-request signal RT', e.g., modified reset-request signals $RT'_{102}$, $RT'_{115}$, $RT'_{120}$ and $RT'_{RP}$, by selectively asserting the original reset-request signals $RT_{102}$, $RT_{115}$, $RT_{120}$ and $RT_{RP}$ via the test signals $CT_{102}$, $CT_{115}$, $CT_{120}$ and $CT_{RP}$. As mentioned before, the combinational logic circuit 420 may also not be provided for all reset-request signals RT.

In the embodiment, the reset circuit 116a comprises also an additional masking circuit 422 configured to selectively mask or unmask the combined reset-request signal(s) CRT when a test mode signal TM is asserted. For example, assuming that the combined reset-request signa(s) CRT are asserted by setting the signal to high and the combined reset-request signa(s) CRT should be masked when the signal TM is set to low, the additional masking circuit 422 may be implemented with a logic AND gate.

Accordingly, in the embodiment considered, the test signals CT, such as $CT_{102}$, $CT_{115}$, $CT_{120}$ and $CT_{RP}$, and the test mode signal TM are generated/provided by the control circuit 40. Moreover, the control circuit 40 monitors the combine reset-request signal(s) CRT.

Figure 6:
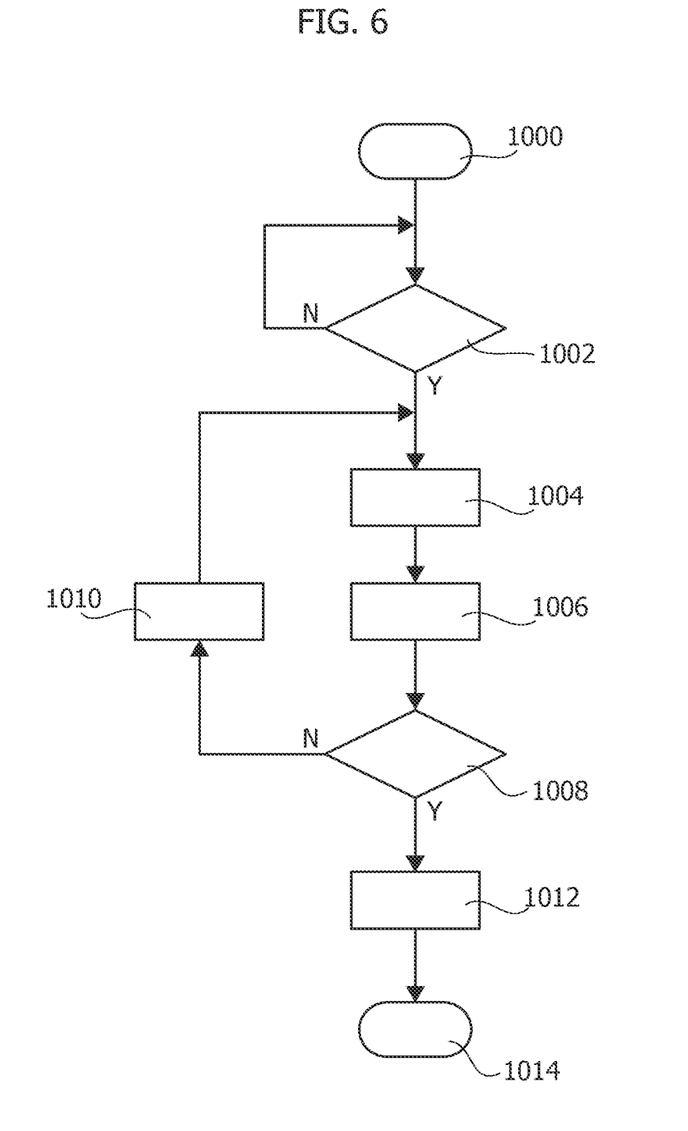
FIG. 6 shows an embodiment of the operation of the test circuit.

FIG. 6 shows an embodiment of the operation of the test circuit, in particular the control circuit 40.

Specifically, after a start step 1000, the control circuit 40 waits at a step 1002 until a test of the reset circuit 116a is requested.

Generally, the test may be requested via software and/or via hardware. For example, for this purpose, the control circuit 40 may be connected to the communication system 114. For example, in this case, a microprocessor 1020 of a processing core 102 may generate the respective test request via software instructions, wherein the test request is then transmitted to the control circuit 40 via the communication system 114. For example, in this way may be requested one or more tests with different values for the masking signals TE, which thus permits to verify also the operation of the masking circuits 1162.

However, the inventors have observed that such a software-controlled test is usually not advisable. In fact, as mentioned before, the combined reset-request signal(s) CRT are masked during the test. Accordingly, this masking would also mask a real reset-request occurring during the test. For this reason, in various embodiments, the test is requested directly in hardware as part of a Build-In Self-Test (BIST) of the processing system 10a, which is executed while the microprocessor(s) 1020 are not started yet. For example, as shown in FIG. 5, in this case, the processing system 10a may comprise a diagnostic circuit 118 implementing a BIST control circuit. For example, as described in the previously cited document 102021000007871, in response to switching on the processing system 10a, i.e., in response to one or more of the reset-request signals RT, the processing system 10a may be configured to execute the following phases in sequence during a (complex) reset procedure:

- a first reset step, where the reset circuit 116a executes a first (system) reset of the processing system 10a;
- a diagnostic phase, where the diagnostic circuit 118 executes the one or more tests of the processing system 10a;
- an optional second reset phase, where the reset circuit 116a executes a second (system) reset of the processing system 10a; and
- a software runtime phase, where the one or more microprocessors 1020 are started and execute software instruction.

For example, a microprocessor 1020 may be reset by asserting the respective reset signal $RST_{102}$ and the microprocessor 1020 may be started by de-asserting the respective reset signal $RST_{102}$. Accordingly, in this case, the reset signal $RST_{102}$ may be asserted during the first reset phase, the diagnostic phase, and the optional second reset phase. Accordingly, in general, one or more circuits of the processing system 10a may be kept under reset (by asserting the respective reset signal RST) during the diagnostic phase, such as the processing core(s) 102 and most (or all) of the resources/peripherals 106, while one or more other circuits may be active (e.g., with the respective reset signal RST being de-asserted) during the diagnostic phase, such as the memory controller 110, the diagnostic circuit 118 and the fault collection and error management circuit 120.

In various embodiments, a state control circuit, e.g., implemented within the FSM 1168, may thus automatically request the execution of one or more build-in self-test operations during the reset procedure. Accordingly, in this case, the test may be requested as part of these BIST operation.

For example, this is also shown in FIG. 5, where the reset management circuit 1168 is configured to provide a signal SDP to the diagnostic circuit 118, wherein the reset management circuit 1168 asserts the signal SDP in order to start the diagnostic phase, i.e., request the execution of the BIST. In response to the signal SDP, the diagnostic circuit 118 starts then one or more tests. For example, in various embodiments, the diagnostic circuit 118 provides a signal SRD to the control circuit 40, wherein the diagnostic circuit 118 asserts the signal SRD in order to request the start of the test of the reset circuit 116a, i.e., the control circuit 40 determines at the step 1002 whether the signal SRD is asserted. Once the control circuit 40 has executed the test, the control circuit 40 may assert a signal ERD in order to indicate the completion of the test, and provide a signal STATE indicating the result of the tests. Accordingly, once all tests have been executed, e.g., in response to the signal ERD, the diagnostic circuit 118 may assert a signal EDP in order to indicate the end of the diagnostic phase. In response to the signal EDP, the reset management circuit 1168 may thus execute the second reset phase and/or start the microprocessor(s) 1020. Usually, the diagnostic circuit 118 does not provide the result of the test to the reset management circuit 1168, but the result (such as the signal STATE) is used to generate an error signal provided to the fault collection and error management circuit 120 and/or the diagnostic circuit 118 is connected to the communication system 114, whereby a microprocessor 1020 may read the result(s) of the diagnostic phase by sending read requests to the communication system 114. Generally, the operation of the diagnostic circuit 118 could also be implemented directly within the reset circuit 116a, e.g., within the reset management circuit 1168.

Accordingly, in case no test has been requested (output "N" of the verification step 1002), the control circuit 40 returns to the step 1002. Conversely, in case a test has been requested (output "Y" of the verification step 1002), the control circuit 40 proceeds to a step 1004 where the control circuit 40 sets the signal TM (e.g., to low) in order to mask the combined reset-request signal(s) CRT and asserts one of the test signals CT, thereby asserting the respective reset-request signals RT'.

At a following step 1006, the control circuit 40 evaluates then the logic level of the combined reset-request signal(s) CRT.

For example, in case the test has been requested via hardware as part of a BIST, after the (first) reset phase, the masking signals TE are usually set to not mask the reset-request signals RT, e.g., the signals TE are set to high. Accordingly, in this case, the control circuit 40 may be configured to compare at the step 1006 each combined reset-request signal CRT with a respective expected value. For example, assuming that a combined reset-request signal CRT is generated by combining all reset-request signals RT (or more specifically the received reset-requests signals RT'), the combined reset-request signal CRT should be asserted at the step 1006. Accordingly, in case the combined reset-request signal CRT does not have the expected value, e.g., is set to low, the control circuit 40 may set the signal STATE to indicate a (general) failure of the reset circuit 116a and/or a (specific) failure of the currently asserted test signal CT, and thus the respect reset-request signal RT.

At a step 1008, the control circuit 40 may then verify whether all test signals CT have been tested. In case not all test signals CT have been tested (output "N" of the verification step 1008), the control circuit 40 selects at a step 1010 a next test signal CT and returns to the step 1004, where the control circuit 40 asserts then the selected test signal CT, and de-asserts all other test signals CT, thereby asserting only the respective reset-request signal RT'.

Conversely, in case all test signals CT have been tested (output "Y" of the verification step 1008), the control circuit 40 sets the signal TM (e.g., to high) in order to unmask the combined reset-request signal(s) CRT, and the operation stops at a stop step 1014. Optionally, the control circuit 40 may also signal the completion of the test at the step 1012, e.g., by asserting the completion signal ERD for the diagnostic circuit 118.

Accordingly, in the embodiment considered, the test circuit 40, 420, 422 sequentially asserts one of the reset-request signal RT'. Preferably, prior to verifying the logic value of the combined reset signal(s) CRT, the control circuit 40 waits for one or more clock cycles, in order to ensure that the logic level of the reset-request signal RT' may be propagated to the combined reset-request signal(s) CRT. Accordingly, in this way, the control circuit 40 may acquire and/or verify the logic level of the combined reset-request signal(s) CRT, e.g., in order to verify whether the reset event has been propagated correctly to the output of the combinational logic circuit 1166. During the test mode, the reset event does not generate an actual reset, because the combined reset-request signal(s) CRT are masked via the masking circuit 422 and the test-mode signal TM.

In various embodiments, no additional circuits may be provided in order to test the correct functionality of the masking circuit 422. In fact, the correct functionality of this masking gate 422 is implicitly granted by two facts:

in case the output of the masking gate 422 would be stuck at a level that prevents any reset to be propagated correctly to the reset management circuit 1168, then the processing system 10a, in particular the processing core(s) 102, would never be started after a power-on reset-request $RT_{115}$ and an external watchdog may be used to detect this malfunction; and in case the output of the masking gate 422 would be stuck at a level that generates a reset-request, the processing system 10a would stay under reset, and an external watchdog may again be used to detect this malfunction.

As mentioned before, in various embodiments, the control circuit 40 (or a further test circuit) may be used to also verify the reset signals RST used to reset individual circuits/IPs.

Figure 7:
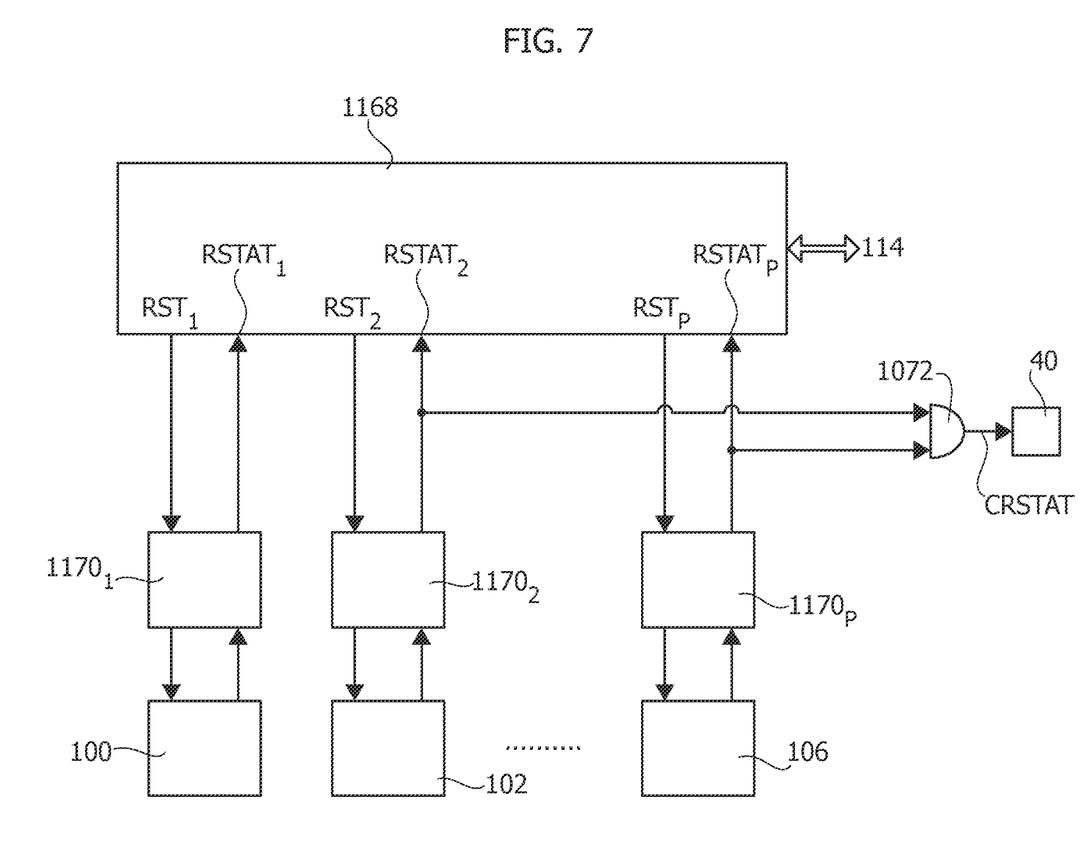
FIG. 7 shows an embodiment of the connection of the reset circuit of FIG. 5 to a plurality of circuits.

FIG. 7 shows an embodiment of the connection of the reset circuit 116a, in particular the reset management circuit 1168, to a plurality of circuits. For example, in FIG. 7, the reset management circuit 1168 generates a plurality of p reset signals, wherein:

the first reset signal $RST_1$ is provided to a memory controller 100;
the second reset signal $RST_2$ is provided to a processing core 102;
the last reset signal $RST_p$ is provided to a resource 106.

As mentioned before, other individual reset signals RST may be provided to other circuits of the processing system 10a, such as a DMA controller 110 and the fault collection and error management circuit 120.

In the embodiment considered, each reset signal RST is provided to the respective circuit via an optional synchronization circuit 1170, such as synchronization circuit $1170_1, \ldots, 1170_p$, e.g., implemented via one or more flip-flops connected in cascade.

Moreover, in the embodiment considered, each circuit provides one or more reset-status signal RSTAT, e.g., reset-status signal $RSTAT_1, \ldots, RSTAT_p$, which indicate whether the respective device has received the reset-requests and/or is executing a reset.

Accordingly, in order to determine whether a reset signaled via a given reset signal RST has been correctly propagated to the respective circuit, the processing system 10a may monitor the respective reset-status signals RSTAT.

Specifically, as mentioned before, the reset circuit 116, in particular the reset management circuit 1168 may be configured to assert the reset signals RST in response to the reset-request signals RT. For example, these signals RT may signal system reset-requests, wherein the reset management circuit 1168 asserts and de-asserts the reset signals RST according to a predetermined sequence. For example, in order to implement a system reset, the reset management circuit 1168 may assert the reset signals RST almost contemporaneously and then de-assert the reset signals RST according to a given sequence, whereby the respective circuits are started in sequence. In general, by using a plurality of combined reset-request signals CRT (and optionally respective masking signals TE), different types of resets may be supported, wherein the reset management circuit 1168 may assert and de-assert a respective sub-set of the reset signals RST according to a respective predetermined sequence.

For example, in this case, the control circuit 40 may be configured to automatically monitor the signals RSTAT during the reset procedure, e.g., in response to a power-on reset $RST_{115}$ of the processing system 10a, because in this case, all status signals RSTAT should signal that the respective circuit has received the reset-request signaled via the respective reset signal RST.

Specifically, during a reset procedure happening in response to a power-on, usually most circuits, such as the processing core(s) 102 and the peripherals 106, are under reset also during the diagnostic/BIST phase. Conversely, other circuits may not be under reset during the diagnostic phase. However, usually these circuits, such as the memory controller 100, the BIST controller 118, and the fault collection and error management circuit 120, are essential for the operation of the processing system 10a, i.e., the microprocessor(s) 1020 would not start if these circuits do not operate correctly, and/or these circuits may be tested separately.

Accordingly, once the test has been requested, e.g., via the signal SRD, the control circuit 40 may also verify whether the reset-status signals RSTAT of these circuits are asserted, e.g., by generating a combined reset-status signal CRSTAT, e.g., via a logic AND gate 1072, indicating whether all the respective reset-status signals RSTAT are asserted. Accordingly, in various embodiments, the control circuit 40 may be configured to just verify the logic level of the combined reset-status signal CRSTAT associated with the circuits, which should be under reset during the diagnostic phase, i.e., the circuits for which the respective reset signal RST is asserted during the diagnostic phase.

Additionally or alternatively, reset operations of individual circuits are typically not managed via reset-request signals RT, but by selectively asserting one or more of the reset signals RST via software instructions executed by a micro-processor 1020. For example, in this case, the reset management circuit 1168 may comprise or have associated a register interface, e.g., the register interface 117, used to set the logic level of one or more (and preferably all) reset signals RST, and optionally in order to read the logic level of the reset-status signals RSTAT.

Accordingly, in this case, a micro-processor 1020 may verify the connectivity of a given reset signal RST by asserting the respective reset signal RST and verifying the respective reset-status signals RSTAT. Additionally or alternatively, the reset-status signals RSTAT may also in this case be provided to the control circuit 40. For example, the control circuit 40 may monitor the reset signals RST, determine whether one or more of these reset signals RST are asserted, and then determine whether the one or more reset-status signals RSTAT provided by the circuits having the reset signal asserted is also asserted. Accordingly, in case the reset signal RST of a circuit is asserted and the respective reset-status signal RSTAT provided by the same circuit is not asserted, the control circuit 40 may signal a failure, e.g., via an error signal ERR provided to the fault collection and error management circuit 120 and/or an interrupt provided to the processing core(s) 102.

Accordingly, one or more of the embodiments disclosed herein provide solutions for testing the logic and associated signals used to request and generate a reset, covering both system resets reset and individual reset signals.

The described solution may be executed in hardware, with a minimal execution time, minimal area overhead, and no software intervention.

By applying the proposed scheme, the reset generation logic can be at ASIL-D level.

Of course, without prejudice to the principle of the invention, the details of construction and the embodiments may vary widely with respect to what has been described and illustrated herein purely by way of example, without thereby departing from the scope of the present invention, as defined by the ensuing claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A processing system comprising:
a power-supply monitoring circuit configured to generate a reset-request signal when the processing system is switched on;
a processing core comprising a microprocessor configured to execute software instructions and to be reset in response to a respective reset signal;
a memory controller configured to read the software instructions from a non-volatile memory;
a communication system connecting the memory controller to the processing core;
one or more further circuits configured to be reset in response to a respective further reset signal;
a diagnostic circuit configured to selectively execute one or more tests of the processing system; and
a reset circuit configured to:
receive the reset-request signal and one or more further reset-request signals, wherein the one or more further reset-request signals are provided by the processing core, the one or more further circuits and/or a terminal of the processing system; and
generate a combined reset-request signal by combining the reset-request signal and the one or more further reset-request signals,
wherein the processing system is configured to execute the following phases in sequence in response to the combined reset-request signal:
a reset phase, wherein the reset circuit is configured to execute a reset of the processing system by generating the reset signal for the processing core and the further reset signals for the one or more further circuits,
a diagnostic phase, wherein the diagnostic circuit is configured to execute the one or more tests of the processing system, and
a software runtime phase, wherein the microprocessor is configured to start and execute the software instruction,
wherein the processing system comprises a hardware test circuit comprising:
for each of the one or more further reset-request signals, a respective first combinational circuit configured to selectively assert the respective further reset-request signal,
a second combinational logic circuit configured to selectively mask the combined reset-request signal, and
a control circuit configured to repeat the following operations during the diagnostic phase for each of the further reset-request signals:
mask the combined reset-request signal via the second combinational logic circuit,
assert the respective further reset-request signal and de-assert all other further reset-request signals, and
determine whether the combined reset-request signal provided to the second combinational logic circuit is asserted and, in response to determining that the combined reset-request signal is de-asserted, generate a signal indicating a failure of the reset circuit.

2. The processing system according to claim 1, wherein the reset circuit is configured to:
in response to the combined reset-request signal, execute the reset of the processing system by asserting the reset signal for the processing core and the further reset signals for the one or more further circuits, and
once the diagnostic circuit has executed the one or more tests of the processing system, de-assert the reset signal for the processing core and the further reset signals for the one or more further circuits according to a predetermined sequence, thereby starting the microprocessor.

3. The processing system according to claim 2, wherein the diagnostic circuit is configured to:
execute the one or more tests of the processing system in response to a signal indicating a start of the diagnostic phase, and
once having executed the one or more tests of the processing system, generate a signal indicating an end of the diagnostic phase.

4. The processing system according to claim 2, wherein the reset circuit is configured to:
once having completed the reset phase, generate the signal indicating the start of the diagnostic phase, and
in response to the signal indicating an end of the diagnostic phase, start the software runtime phase.

5. The processing system according to claim 2, wherein each of the processing core and the one or more further circuits is configured to assert a respective reset-status signal when the processing core or the one or more further circuits is under reset.

6. The processing system according to claim 2, wherein the control circuit is configured to:
generate a combined reset-status signal by combining the reset-status signals,
determine whether the combined reset-status signal is asserted, and
generate an error signal when the combined reset-status signal is de-asserted.

7. The processing system according to claim 1, wherein the one or more further circuits configured to be reset in response to a respective reset signal comprise at least one of:
one or more resources or peripherals, wherein each resource or peripheral is configured to be reset in response to a respective reset signal; or
a Direct Memory Access Controller configured to be reset in response to a respective reset signal.

8. The processing system according to claim 1, wherein the one or more further reset-request signals comprise at least one of:
a first further reset-request signal generated by the microprocessor via software instructions;
a second further reset-request signal generated by a fault collection and error management circuit as a function of one or more error signals received from the memory controller, the processing core, and/or a resource or peripherals of the processing system; or
a third further reset-request signal received via the terminal of the processing system.

9. The processing system according to claim 1, wherein the reset circuit is configured to:
assert the combined reset-request signal when at least one of the reset-request signal and the one or more further reset-request signals is asserted, and
de-assert the combined reset-request signal when the reset-request signal and the one or more further reset-request signals are de-asserted.

10. The processing system according to claim 1, wherein the reset circuit comprises for each further reset-request signal, a respective masking circuit configured to mask the respective further reset-request signals as a function of a respective masking signal.

11. The processing system according to claim 8, further comprising a register interface connected to the communication system and configured to provide the masking signals.

12. The processing system according to claim 1 wherein the processing core, the one or more further circuits and the reset circuit are arranged at respective positions within the processing system, and wherein, for each first combinational circuit, a distance between the first combinational circuit and the respective processing core or further circuit is smaller than a distance between the first combinational circuit and the reset circuit.

13. An integrated circuit comprising:
the processing system according to claim 1.

14. A vehicle comprising:
a plurality of processing systems, each processing system being the processing system according to claim 1, wherein the processing systems are connected via a further communication system.

15. A method for operating the processing system according to claim 1, the method comprising:
repeating the following operations during the diagnostic phase for each of the further reset-request signals:
masking the combined reset-request signal via the second combinational logic circuit,
asserting the respective further reset-request signal and de-assert all other further reset-request signals, and
determining whether the combined reset-request signal is asserted, and
in response to determining that the combined reset-request signal is de-asserted, generating a signal indicating a failure of the reset circuit.

16. A processing system comprising:
a reset circuit configured to:
receive a reset-request signal and one or more further reset-request signals, wherein the one or more further reset-request signals are provided by a processing core, one or more further circuits and/or a terminal of the processing system; and
generate a combined reset-request signal by combining the reset-request signal and the one or more further reset-request signals,
wherein the processing system is configured to execute the following phases in sequence in response to the combined reset-request signal:
a reset phase, wherein the reset circuit is configured to execute a reset of the processing system by generating the reset signal for the processing core and the further reset signals for the one or more further circuits,
a diagnostic phase, wherein a diagnostic circuit is configured to execute one or more tests of the processing system, and
a software runtime phase; and
a hardware test circuit comprising:
for each of the one or more further reset-request signals, a respective first combinational circuit configured to selectively assert the respective further reset-request signal,
a second combinational logic circuit configured to selectively mask the combined reset-request signal, and
a control circuit configured to repeat the following operations during the diagnostic phase for each of the further reset-request signals:
mask the combined reset-request signal via the second combinational logic circuit,
assert the respective further reset-request signal and de-assert all other further reset-request signals, and
determine whether the combined reset-request signal provided to the second combinational logic circuit is asserted and, in response to determining that the combined reset-request signal is de-asserted, generate a signal indicating a failure of the reset circuit.

17. The processing system according to claim 16, wherein the reset circuit is configured to:
in response to the combined reset-request signal, execute the reset of the processing system by asserting the reset signal for the processing core and the further reset signals for the one or more further circuits, and
once the diagnostic circuit has executed the one or more tests of the processing system, de-assert the reset signal for the processing core and the further reset signals for the one or more further circuits according to a predetermined sequence.

18. The processing system according to claim 17, wherein the diagnostic circuit is configured to:
execute the one or more tests of the processing system in response to a signal indicating a start of the diagnostic phase, and
once having executed the one or more tests of the processing system, generate a signal indicating an end of the diagnostic phase.

19. The processing system according to claim 17, wherein the reset circuit is configured to:
once having completed the reset phase, generate the signal indicating a start of the diagnostic phase, and
in response to the signal indicating an end of the diagnostic phase, start the software runtime phase.

20. The processing system according to claim 17, wherein the control circuit is configured to:
generate a combined reset-status signal by combining the reset-status signals,
determine whether the combined reset-status signal is asserted, and
generate an error signal when the combined reset-status signal is de-asserted.

* * * * *